United States Patent
Yaung et al.

(10) Patent No.: US 7,432,576 B2
(45) Date of Patent: *Oct. 7, 2008

(54) GRID METAL DESIGN FOR LARGE DENSITY CMOS IMAGE SENSOR

(75) Inventors: Dun-Nian Yaung, Taipei (TW); Shou-Gwo Wuu, Hsin-Chu (TW); Chien-Hsien Tseng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 670 days.

This patent is subject to a terminal disclaimer.

(21) Appl. No.: 10/945,342

(22) Filed: Sep. 20, 2004

(65) Prior Publication Data

US 2005/0030403 A1 Feb. 10, 2005

Related U.S. Application Data

(63) Continuation of application No. 10/042,074, filed on Jan. 8, 2002, now Pat. No. 6,815,787.

(51) Int. Cl.
*H01L 31/062* (2006.01)

(52) U.S. Cl. .................... 257/444; 257/292; 257/233; 257/257; 257/258; 257/E27.133

(58) Field of Classification Search ................ 257/444, 257/233, 292, 257, 258, 462, E27.133
See application file for complete search history.

(56) References Cited

U.S. PATENT DOCUMENTS

| | | | | |
|---|---|---|---|---|
| 5,278,105 A | 1/1994 | Eden et al. | | 437/250 |
| 5,798,298 A | 8/1998 | Yang et al. | | 438/622 |
| 5,915,201 A | 6/1999 | Chang et al. | | 438/631 |
| 5,926,733 A | 7/1999 | Heo | | 438/622 |
| 6,180,448 B1 | 1/2001 | Lee | | 438/253 |
| 6,379,992 B2 | 4/2002 | Jo | | 438/70 |
| 6,433,767 B1 * | 8/2002 | Murade | | 345/92 |
| 6,815,787 B1 * | 11/2004 | Yaung et al. | | 257/443 |

* cited by examiner

*Primary Examiner*—Evan Pert
*Assistant Examiner*—Tan N Tran
(74) *Attorney, Agent, or Firm*—Thomas, Kayden, Horstemeyer & Risley

(57) ABSTRACT

A new grid metal design for image sensors is disclosed which is comprised of a semiconductor image sensor chip having a pixel region covering most of the chip and a logic circuit region on the chip periphery. The pixel region contains, an array of image pixels where for each image pixel the majority of its area is occupied by a light sensing element and the other image pixel circuit elements are arranged in the periphery of the image pixel without overlapping the image-sensing element. A number of metal levels are of the first type, at which functional metal patterns exist both for the chip peripheral logic circuits and for the pixel circuit elements. A number of metal levels are of the second type, at which functional metal patterns exist only for the chip peripheral logic circuits and dummy metal patterns cover the pixel region except for the light sensing elements. A first dielectric layer is disposed under the first metal layer, an interlevel dielectric layer between metal levels of either type and a passivation layer over the last metal level.

4 Claims, 4 Drawing Sheets

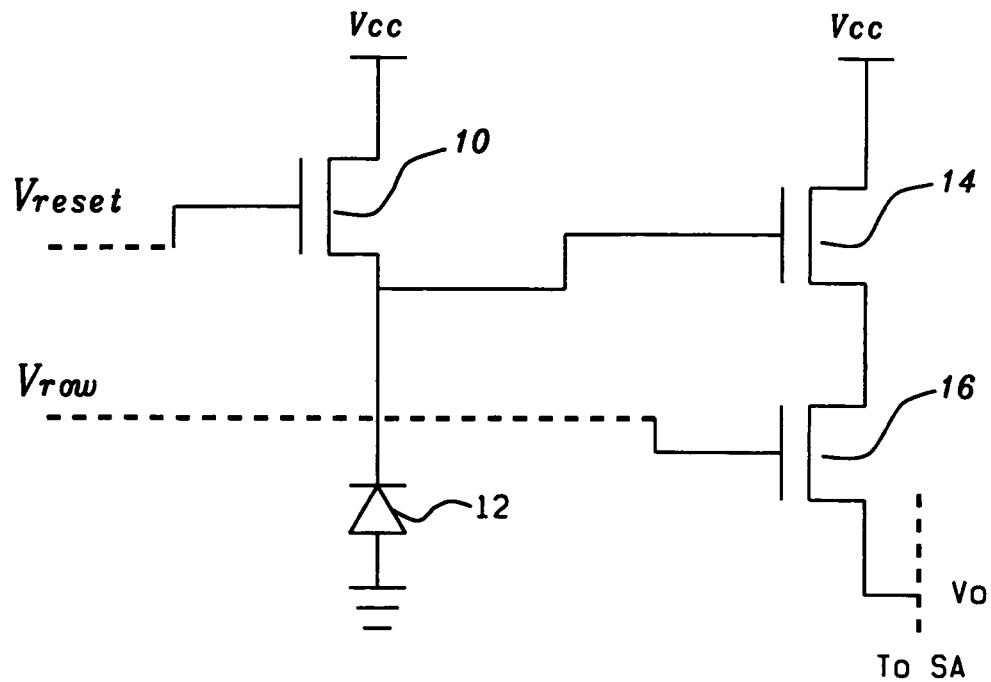
*FIG. 1 - Prior Art*
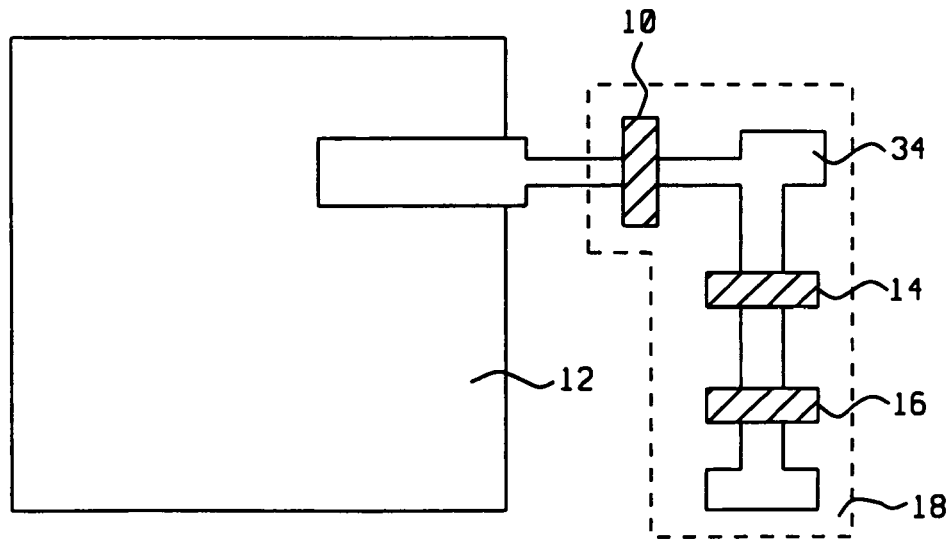
*FIG. 2 - Prior Art*

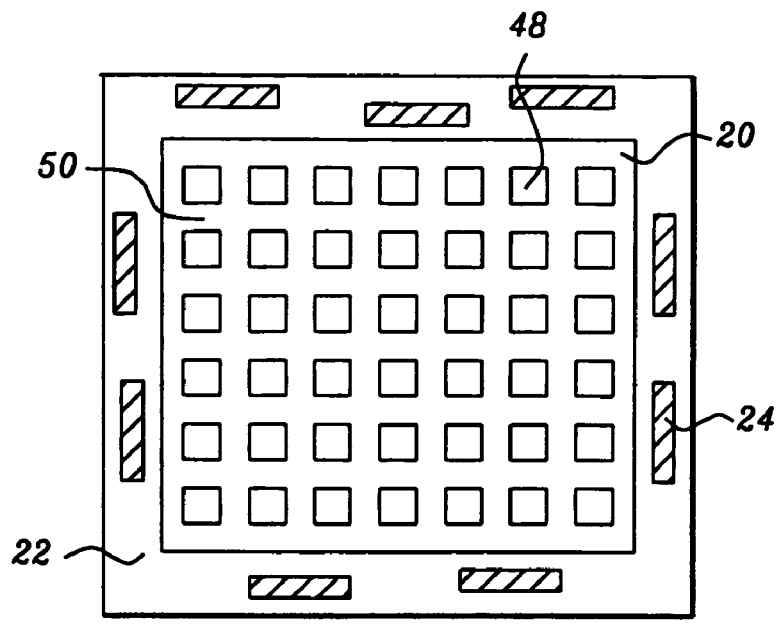
FIG. 3 - Prior Art
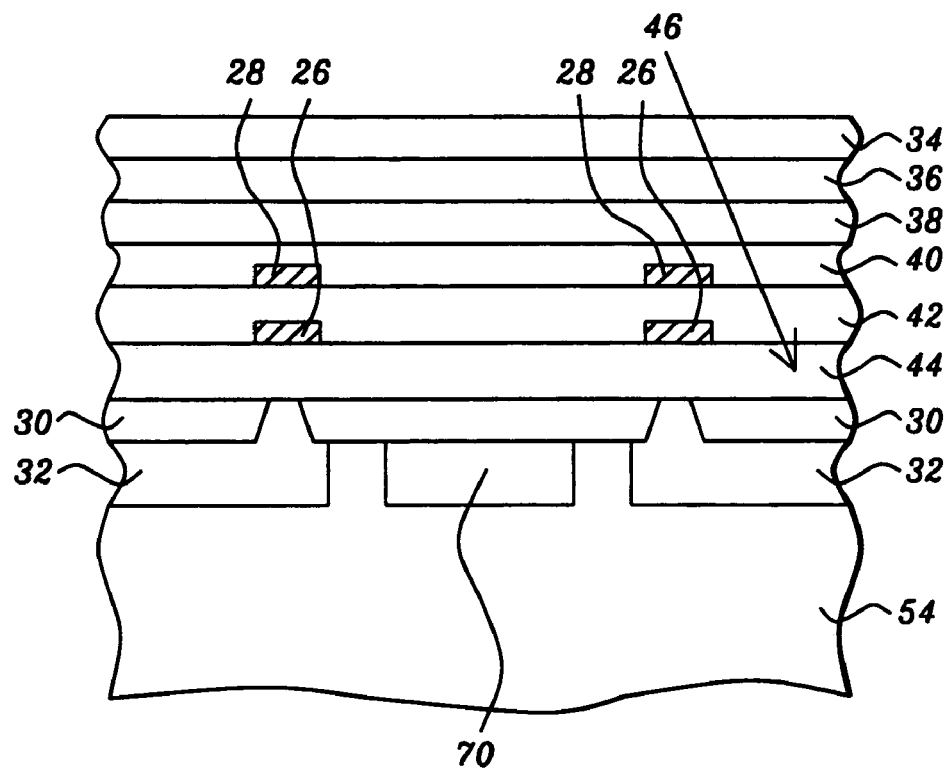
FIG. 4 - Prior Art

GRID METAL DESIGN FOR LARGE DENSITY CMOS IMAGE SENSOR

CROSS-REFERENCE TO RELATED APPLICATION

This application is a continuation of U.S. patent application Ser. No. 10/042,074, filed Jan. 8, 2002 now U.S. Pat. No. 6,815,787.

BACKGROUND OF THE INVENTION (1) Field of the Invention

The present invention relates generally to semiconductor integrated circuit technology and more particularly to active pixel sensor technology.

(2) Description of Prior Art

CMOS image sensors (CIS) have many advantages over CCD image sensors. Some of these are lower voltage operation, lower power consumption, compatibility with logic circuitry, random access and lower cost. Due to the increase in imager density, the area allotted to the pixels is a large percentage of the chip area. In conventional image pixels there are two levels of metal are used for interconnection. However, five metal levels are used for the peripheral logic circuits. This disparity in the metal levels between the pixel and logic regions, when combined with the large percentage of the chip area occupied by the pixels, provide for conditions in which serious loading effects are found in metal etching. These affects occur because the etch rate depends on the amount of etchable surface exposed to the etchants and are readily encountered as a result of changes in etch rate when the fraction of etchable exposed material changes during the etch.

A popular conventional active pixel based on CMOS is shown in FIG. 1. It contains one photo-diode and three n-channel MOS transistors (for reset, source follower, and row access). The "reset transistor", 10, is used for resetting the potential of the floating-node of photo-diode 12 to $V_{cc}$. The floating-node of the photo-diode is connected to the gate of "source follower" 14, where its conductance is modulated by the floating-node potential. After reset operation, the potential of photo-diode is modulated (decreasing) by accumulating electrons generated by image light (or photons) during the "image integration" period. After turning on the row access transistor, 16, Vo is read out (one $V_T$ below the floating-node potential) as the output of the image signal. The output is essentially linear with the photo-signal (i.e. floating-node potential), which is proportional to the number of electrons generated by the image light. The number of electrons generated by the image light is in turn proportional to the area of the photodiode junction. A higher sensitivity is therefor achieved for larger area photodiodes. Consequently the photodiode occupies the largest fraction of the pixel area. This is seen in FIG. 2, which shows the layout of a typical CIS pixel. The photodiode, 12, clearly occupies the majority of the pixel area. In FIG. 2, region 18 is the active pixel area containing the pixel circuits except for the photodiode.

FIG. 3 shows a conventional CMOS image sensor chip. The image pixel area, 20, can occupy about 90% of the chip area. This area, usually arranged in the form of a grid matrix array as shown, contains photodiode regions, 48, which take up most of the area and the remaining sensor circuitry, which are placed in the areas 50, peripheral to the photodiodes. Logic circuit, are contained in the chip peripheral area, 22, which also contains metal regions, 24 used for interconnection. Logic circuits require up to five levels of metal. The layered structure of an image pixel region of a CIS is shown in FIG. 4. A photodiode, 70, is situated under a shallow trench isolation region, 30, and other components are included in region 32. All these regions are contained in or on a semiconductor substrate, 54. Only the two metal levels, 26 and 28 are required for interconnection in the image pixel region. These interconnection metal levels do not completely shield the underlying sensor devices from incoming light, which gives rise to extraneous currents and noise that affects the performance of the devices. Furthermore, the two interconnection metal levels are insufficient to adequately collimate incoming light 46 and there is cross talk to nearby sensors, as indicated in FIG. 4.

Methods of reducing loading affects arising during metal etch are disclosed in several patents. U.S. Pat. No. 5,278,105 to Eden et al. discloses a method in which dummy features are introduced to increase the percentage of material remaining after etch and thereby to reduce the loading affect. Dummy metal shaped in blocks are used by Yang et al. in U.S. Pat. No. 5,798,298 to prevent the loading affect during etching for multilevel interconnection. In U.S. Pat. No. 5,915,201 to Chang et al. dummy metal areas with sizes similar to the functional metal lines are distributed among the functional lines reducing the loading affect. Dummy metal patterns are used by Heo to reduce loading effects, as disclosed in U.S. Pat. No. 5,926,733 to Heo. Lee in U.S. Pat. No. 6,180,448 to alleviate the loading affect uses dummy storage electrodes.

SUMMARY OF THE INVENTION

It is a primary objective of the invention to provide grid metal designs that alleviate the loading effects that occur during metal etch. It is another primary objective of the invention to provide a method for achieving grid metal designs that alleviate the loading effects that during metal etch. Yet another primary objective of the invention is to provide grid metal designs that ensure adequate light shielding for the image sensor circuits other than the photodiode. A further primary objective of the invention is to provide a method for achieving grid metal designs that ensure adequate light shielding for the image sensor circuits other than the photodiode. A yet further primary objective of the invention is to provide grid metal structures that Adequately collimate incoming light and prevent cross talk to nearby sensors. Another further primary objective of the invention is to provide a method for achieving grid metal structures that adequately collimate incoming light and prevent cross talk to nearby sensors.

The grid metal design of the invention achieves these objectives. Dummy metal patterns are added to completely cover the regions peripheral to the photodiodes. These dummy metal patterns are therefor disposed over the functional metal levels of the image sensors and over the image sensor circuit elements other than the photodiode, these features being placed in the regions peripheral to the photodiodes. Generally, only two levels of metal are used, for interconnection, in the image pixel regions, while five levels of metal are often required for the logic circuits placed in the chip peripheral area. Three levels of metal are thus available for the dummy metal patterns in the image pixel region. The area of the dummy metal patterns is much larger than that of the metal levels of the peripheral logic circuits and would consequently alleviate the loading affects during metal etching. With complete metal coverage of the regions between the photodiodes, the image sensor circuits other than the photodiodes, which are contained in these regions, are well shielded from the incoming light. The three dummy metal patterns added to the two functional metal levels in the image pixel regions provide five levels of metal that adequately collimate incoming light and prevent cross talk to nearby sensors.

A new grid metal design for image sensors is disclosed which is comprised of a semiconductor image sensor chip having a pixel region covering most of the chip and a logic circuit region on the chip periphery. The pixel region contains an array of image pixels where for each image pixel the majority of its area is occupied by a light sensing element and the other image pixel circuit elements are arranged in the periphery of the image pixel without overlapping the image-sensing element. A number of metal levels are of the first type, at which functional metal patterns exist both for the chip peripheral logic circuits and for the pixel circuit elements. A number of metal levels are of the second type, at which functional metal patterns exist only for the chip peripheral logic circuits and dummy metal patterns cover the pixel region except for the light sensing elements. A first dielectric layer is disposed under the first metal layer, an interlevel dielectric layer between metal levels of either type and a passivation layer over the last metal level.

BRIEF DESCRIPTION OF THE DRAWINGS

In the accompanying drawing forming a material part of this description, there is shown:

FIG. 1 show, a conventional active CMOS pixel.

FIG. 2 shows a layout of a conventional CMOS active pixel.

FIG. 3 shows a layout of conventional CMOS image sensor chip.

FIG. 4 shows a layered structure of the pixel area of a conventional CMOS image sensor chip.

DESCRIPTION OF THE PREFERRED EMBODIMENTS

Figure 5:
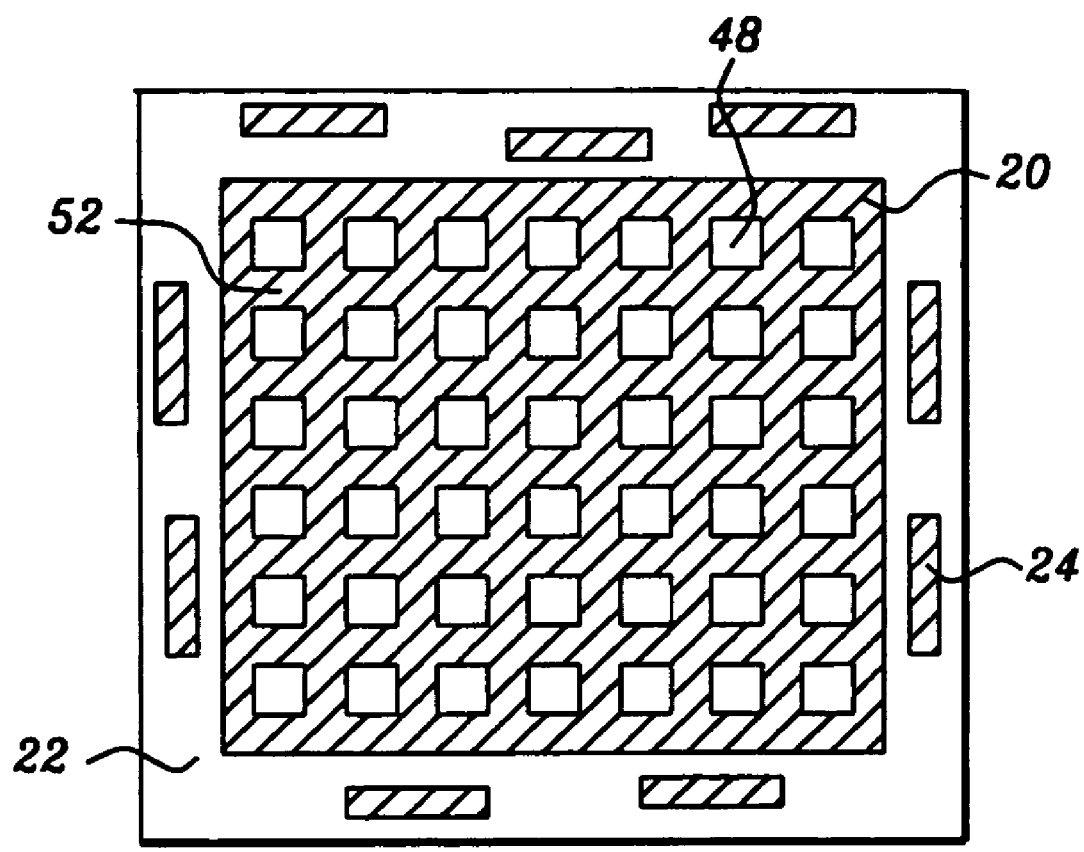
FIG. 5 shows a layout of a CMOS image sensor chip according to the invention.
Figure 6:
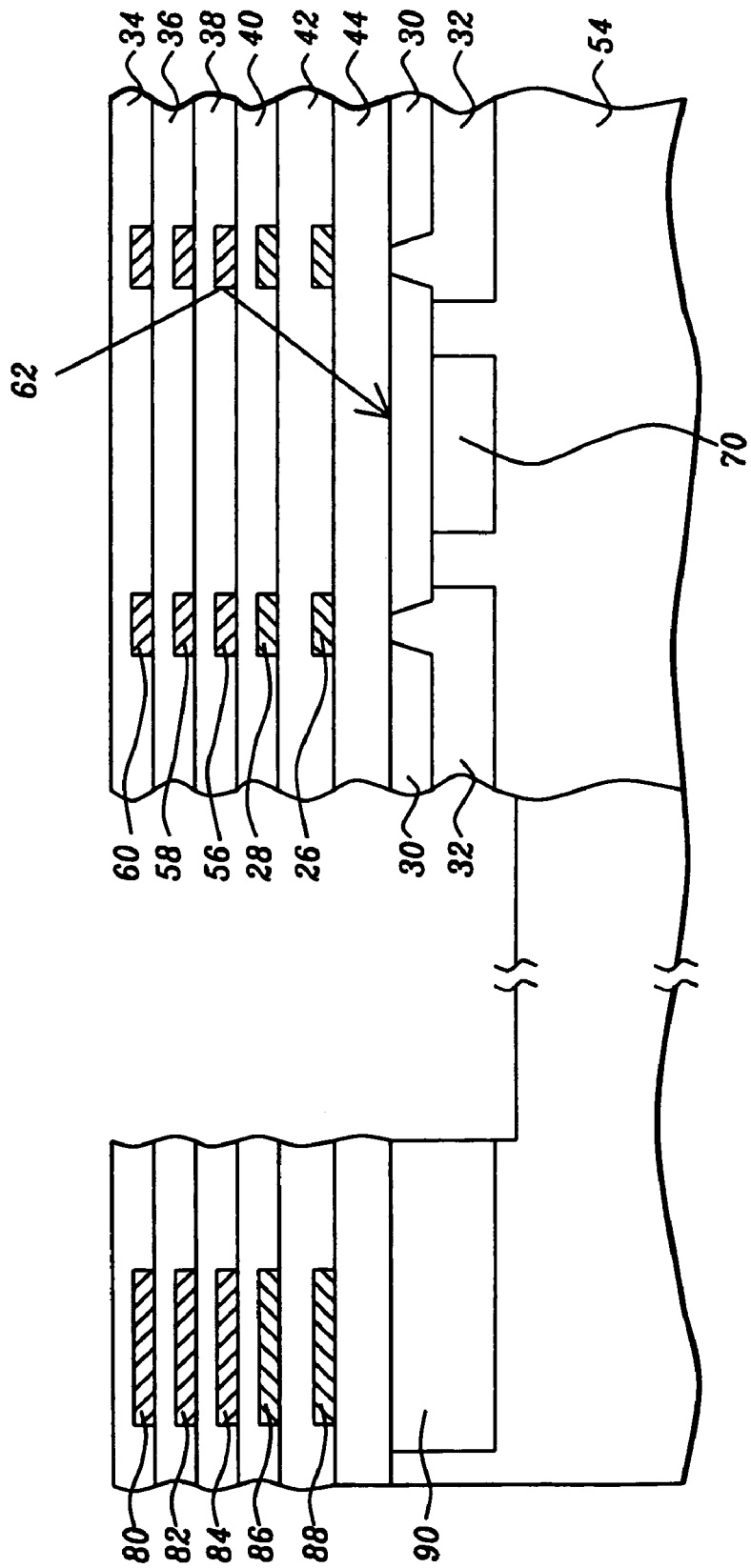
FIG. 6 shows a layered structure of the pixel area of a CMOS image sensor chip according to the invention.

The structure of a preferred embodiment of the new grid metal design for CMOS image sensor chips is shown in FIG. 5, which depicts the layout and in FIG. 6, in which is shown the layered structure of the pixel area. In the new grid metal design the photodiode peripheral areas, which in the conventional design, 50, are sparsely covered by two levels, 26 and 28, of interconnection metal, are completely covered by additional full levels of metal, 52. As in conventional CMOS image sensor chips the image pixel area, 20 can occupy about 90% of the chip area. This area, usually arranged in the form of a grid matrix array as shown, contains photodiode regions, 48, which take up most of the area and the remaining sensor circuitry, which are placed in the areas 50, peripheral to the photodiodes. Logic circuits are contained in the chip peripheral area, 22, which also contains metal regions, 24. Dummy metal patterns are added to completely cover the region peripheral to the photodiodes. These dummy metal patterns are therefor disposed over the functional metal levels of the image sensors and over the image sensor circuit elements other than the photodiode, these features being placed in the regions peripheral to the photodiodes. Generally, only two levels of metal are used, for interconnection, in the image pixel regions, while five levels of metal, shown in FIG. 6 as 80, 82, 84, 86, and 88 are often required for the logic circuits, 90, placed in the chip peripheral area. Three levels of metal are thus available, essentially for free, for the dummy metal patterns in the image pixel region, and these are the three metal levels, 56, 58 and 60 are the dummy patterns of preferred embodiments of the invention. The area of the dummy metal patterns is much larger than that of the metal levels of the peripheral logic circuits. The exposed surface area of the dummy metal levels does not change appreciably during metal etch and consequently there is only a small fractional change during metal etch in the exposed metal surface area of the chip. The loading affects during metal etching are therefore alleviated. With complete metal coverage of the photodiode peripheral regions, the image sensor circuits other than the photodiodes, which are contained in these regions, are well shielded from the incoming light. In a conventional CMOS image sensor the pixel interconnection metal levels do not completely shield the underlying sensor devices from incoming light, which can result in extraneous currents and noise that affects the performance of the devices. With the new grid metal design of the invention, which includes complete metal coverage of the photodiode peripheral regions that shields the sensor devices from incoming light, these extraneous current and noise are not generated. Furthermore, the two interconnection metal levels are insufficient to adequately collimate incoming light 46 and there is cross talk to nearby sensors, as indicated in FIG. 4. In preferred embodiments of the invention three dummy metal patterns are added to the two functional metal levels in the image pixel regions. These provide five levels of metal that adequately collimate incoming light 62 and prevent cross talk to nearby sensors, as indicated in FIG. 6. In preferred embodiments depicted in FIG. 6 the first two metal levels are functional in both the image pixel regions and in the chip peripheral area. Such metal levels are denoted levels of the first type. Thus regions 26 and 88, which make up the first metal level, are constituents of a metal level of the first type. Similarly regions 28 and 86. which make up the second metal level are constituents of a metal level of the first type. In preferred embodiments depicted in FIG. 6. metal levels 3, 4, and 5 are not functional in the image pixel regions. Such metal levels are denoted levels of the second type, Thus regions 56 and 84, which make up the third metal level, are constituents of a metal level of the second type. In this case region 84 haiwens to be functional, it would be a metal level of the second type even if it were not functional. Similarly, regions 58 and 82, which make up the fourth metal level, are constituents of a metal level of the second type, and also regions 60 and 80, which make up the fifth metal level, are constituents of a metal level of the second type.

Fabrication of embodiments of the new grid metal design is the same as for conventional designs up to the interlevel dielectric layer 40, which is disposed over the interlevel dielectric layers 42 and 44, and the functional metal levels 26 and 28. In the new grid metal design a dummy metal layer, 56, covering the photodiode peripheral regions is patterned and deposited. This metal layer, formed at the same time as the third metal level of the logic circuits contained in the chip peripheral area, covers all of the image pixel area, 20, except for the photodiode regions. Metals that can be used for the metal layer 56 include copper, gold, aluminum, cobalt, tungsten, and composites of these and other metals and various silicide. An interlevel dielectric layer, 38, is then deposited concurrent with the deposition of this interlevel dielectric layer for the chip peripheral logic circuits. Tie interlevel dielectric layer can be composed of materials such as silicon oxide, silicon nitride or silicon oxynitride. A second dummy metal layer, 58, covering the photodiode peripheral area is then patterned and deposited concurrently with the fourth metal level of the of the chip peripheral logic circuits. Metals that can be used for the metal layer 58 include copper, gold, aluminum, cobalt, tungsten, and composites of these and other metals and various silicide. An interlevel dielectric layer, 36, is then deposited concurrent with the deposition of this interlevel dielectric layer for the chip peripheral logic circuits. The interlevel dielectric layer can be composed of materials such as silicon oxide, silicon nitride or silicon oxynitride. A third dummy metal layer, 60, covering the photodiode peripheral area is then patterned and deposited concurrently with the fifth metal level of the of the chip peripheral logic circuits. Metals that can be used for the metal layer 60 include copper, gold, aluminum cobalt, tungsten, and composites of these and other metals and various silicide. A passivation dielectric layer, 34, is deposited overall which can be composed of such materials as silicon oxide, silicon nitride or silicon oxynitride.

The description of preferred embodiments of the invention above is given for the case of CMOS image sensors, where the photosensitive devise is a photodiode and there are two functional metal levels in the image pixel while the chip peripheral circuits contain five metal levels. Other embodiments of the invention pertain to other image sensors where the photosensitive device need not be a photodiode and the number of pixel metal level could be other than two and the number of chip peripheral logic circuit metal levels could be different than five. For example, bipolar image sensors could have an emitter-base junction of a bipolar transistor as the photosensitive element and the majority of the pixel area is occupied by this element. The number of operational pixel metal levels can be less than the number of chip peripheral metal levels. In these cases the embodiments of the invention consist of adding dummy metal layers in the pixel area covering the regions peripheral to the photosensitive elements. The dummy layers being added for those levels in which metal is deposited in the chip peripheral logic circuits but for which in the conventional design there was no metal deposited hi the pixel area.

While the invention has been particularly shown and described with reference to the preferred embodiments thereof, it will be understood by those skilled in the art that various changes in form and detail may be made without departing from the spirit and scope of the invention.

What is claimed is:

1. A semiconductor image sensor structure comprising:
   a pixel region containing a plurality of photodiodes;
   a periphery logic circuit region surrounding the pixel region;
   a number of metal levels of the first type, wherein each of the metal levels of the first type exist both for the pixel region and for the periphery logic circuit region; and
   a number of metal levels of the second type, wherein each of the metal levels of the second type exist for the periphery logic circuit region and dummy metal patterns covering the pixel region except for the photodiodes, where the total number of metal levels of the first and second types is at least five.

2. The structure as claimed in claim 1, wherein the number of metal levels of the second type is three.

3. A semiconductor image sensor structure comprising:
   a pixel region containing a plurality of photodiodes;
   a periphery logic circuit region surrounding the pixel region;
   a number of metal levels of the first type, wherein each of the metal levels of the first type exist both for the pixel region and for the periphery logic circuit region; and
   a number of metal levels of the second type, wherein each of the metal levels of the second type exist for the periphery logic circuit region and dummy metal patterns covering the pixel region except for the photodiodes, where the total number of metal levels of the first and second types is sufficient to collimate incoming light.

4. The structure as claimed in claim 3, wherein the number of metal levels of the second type is three.

* * * * *